(12) United States Patent
Wakii et al.

(10) Patent No.: US 7,057,463 B2
(45) Date of Patent: Jun. 6, 2006

(54) DIFFERENTIAL AMPLIFIER WITH IMPROVED FREQUENCY CHARACTERISTIC

(75) Inventors: Takeshi Wakii, Kyoto (JP); Sho Maruyama, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 11/061,256

(22) Filed: Feb. 18, 2005

(65) Prior Publication Data

US 2005/0146382 A1    Jul. 7, 2005

Related U.S. Application Data

(63) Continuation of application No. PCT/JP04/07495, filed on May 31, 2004.

(30) Foreign Application Priority Data

Jun. 3, 2003    (JP) .............................. 2003-158536

(51) Int. Cl.
    *H03F 3/68*    (2006.01)
(52) U.S. Cl. ...................... 330/295; 330/253; 330/257
(58) Field of Classification Search ................ 330/295, 330/253, 257
    See application file for complete search history.

(56) References Cited

U.S. PATENT DOCUMENTS

| 5,072,220 | A | * | 12/1991 | Petschacher et al. | ......... | 341/156 |
| 5,432,477 | A | * | 7/1995 | Nishiyama et al. | ......... | 330/254 |
| 5,701,099 | A | * | 12/1997 | Shafir | ......................... | 327/552 |
| 5,821,824 | A | * | 10/1998 | Mentzer | ....................... | 331/57 |
| 6,184,750 | B1 | * | 2/2001 | Somerville | .................. | 330/255 |
| 6,400,227 | B1 | * | 6/2002 | Goldfarb et al. | ............. | 330/295 |

FOREIGN PATENT DOCUMENTS

| JP |    52-29141 | 3/1977 |
| JP |    4-165804 | 6/1992 |

OTHER PUBLICATIONS

David Johns et al., "Analog Integrated Circuit Design," John Wiley & Sons, Inc., 1997, p. 274.
International Search Report for International Application No. PCT/JP2004/007495 dated Sep. 14, 2004.

* cited by examiner

*Primary Examiner*—Patricia Nguyen
(74) *Attorney, Agent, or Firm*—Cantor Colburn LLP (57) ABSTRACT

An amplifier for amplifying an input signal, having a plurality of amplifier stages each having a gain smaller than a target gain. The plurality of amplifier stages are connected in parallel and share the load of current amplification, and add output currents obtained from their respective amplifications to achieve the target gain as a whole.

1 Claim, 5 Drawing Sheets

DIFFERENTIAL AMPLIFIER WITH IMPROVED FREQUENCY CHARACTERISTIC

CROSS-REFERENCE TO RELATED APPLICATION

The present application is a continuation of PCT/JP2004/007495, filed on May 31, 2004, the entire contents of which are incorporated herein by reference, and which claims the benefit of the date of the earlier filed Japanese Patent Application No. JP 2003-158536 filed on Jun. 3, 2003.

BACKGROUND OF THE INVENTION

1. Field of the Invention

The present invention relates to an amplifier. In particular, the invention relates to the technology for improving the frequency characteristic of a differential amplifier.

2. Description of the Related Art

Figure 4:
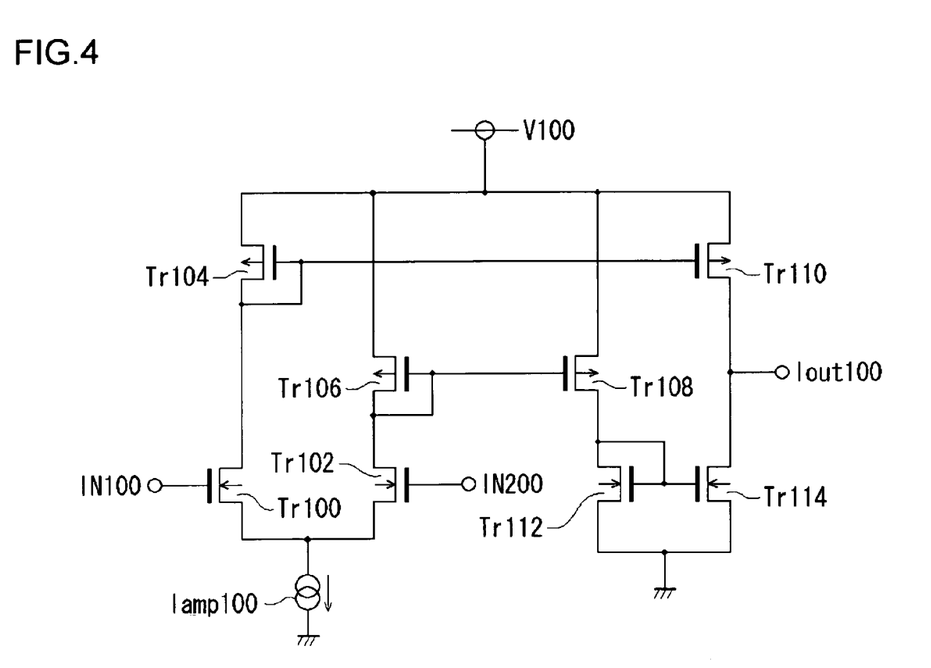
FIG. 4 is a diagram showing the configuration of a conventional differential amplifier.

Conventionally, differential amplifiers for amplifying input signals that are input in a differential manner have been known (for example, see David Johns and Ken Martin "ANALOG INTEGRATED CIRCUIT DESIGN," John Wiley & Sons, Inc., 1997, p. 274). FIG. 4 shows the configuration of a conventional differential amplifier. A first transistor Tr100 and a second transistor Tr102 are connected at their gates to a first input terminal IN100, or noninverting input terminal, and a second input terminal IN200, or inverting input terminal, respectively. The common source of the transistors Tr100 and Tr102 is grounded via a constant current source Iamp100.

The drains of the first transistor Tr100 and the second transistor Tr102 are connected to the drains and gates of a third transistor Tr104 and a fourth transistor Tr106, respectively. The common source of the third transistor Tr104 and the fourth transistor Tr106 is connected to a voltage source V100. The gates of the transistors Tr104 and Tr106 are connected to the gates of a sixth transistor Tr110 and a fifth transistor Tr108, respectively, to constitute current mirrors. The common source of the fifth transistor Tr108 and the sixth transistor Tr110 is connected to the voltage source V100. The drains of the sixth transistor Tr110 and an eighth transistor Tr114 are connected to an output terminal Iout100. The drain of the fifth transistor Tr108 is connected to the drain and gate of a seventh transistor Tr112. The common source of the seventh transistor Tr112 and the eighth transistor Tr114 is grounded. The gates of the transistors Tr112 and Tr114 are connected to each other to constitute a current mirror.

When a positive voltage is applied to the gate of the first transistor Tr100 through the first input terminal IN100, a current flows through the first transistor Tr100 due to the bias current of the constant current source Iamp100. This lowers the voltage of the drain and gate of the third transistor Tr104. The third transistor Tr104 passes the same current as that flowing through the first transistor Tr100. The gate voltage at this point is given to the gate of the sixth transistor Tr110, and the sixth transistor Tr110 also passes a current. The gate width of the sixth transistor Tr110 is designed to pass a current n times as high as that flowing through the third transistor Tr104. Consequently, the source current obtained by amplifying the current flowing through the first transistor Tr100 n times appears on the output terminal Iout100.

When a positive voltage is applied to the gate of the second transistor Tr102 through the second input terminal IN200, a current flows through the second transistor Tr102 due to the bias current of the constant current source Iamp100. This lowers the voltage of the drain and gate of the fourth transistor Tr106. The fourth transistor Tr106 passes the same current as that flowing through the second transistor Tr102. The gate voltage at this point is given to the gate of the fifth transistor Tr108, and the fifth transistor Tr108 also passes the same current as that flowing through the fourth transistor Tr106. When the drain and gate of the seventh transistor Tr112 drop in voltage, the same current as that flowing through the fifth transistor Tr108 flows through the seventh transistor Tr112. The gate voltage at this point is given to the gate of the eighth transistor Tr114, and the eighth transistor Tr114 also passes a current. The gate width of the eighth transistor Tr114 is designed to pass a current n times as high as that of the seventh transistor Tr112. Consequently, a sink current n times as high as the current flowing through the second transistor Tr102 appears on the output terminal Iout100.

Figure 5:
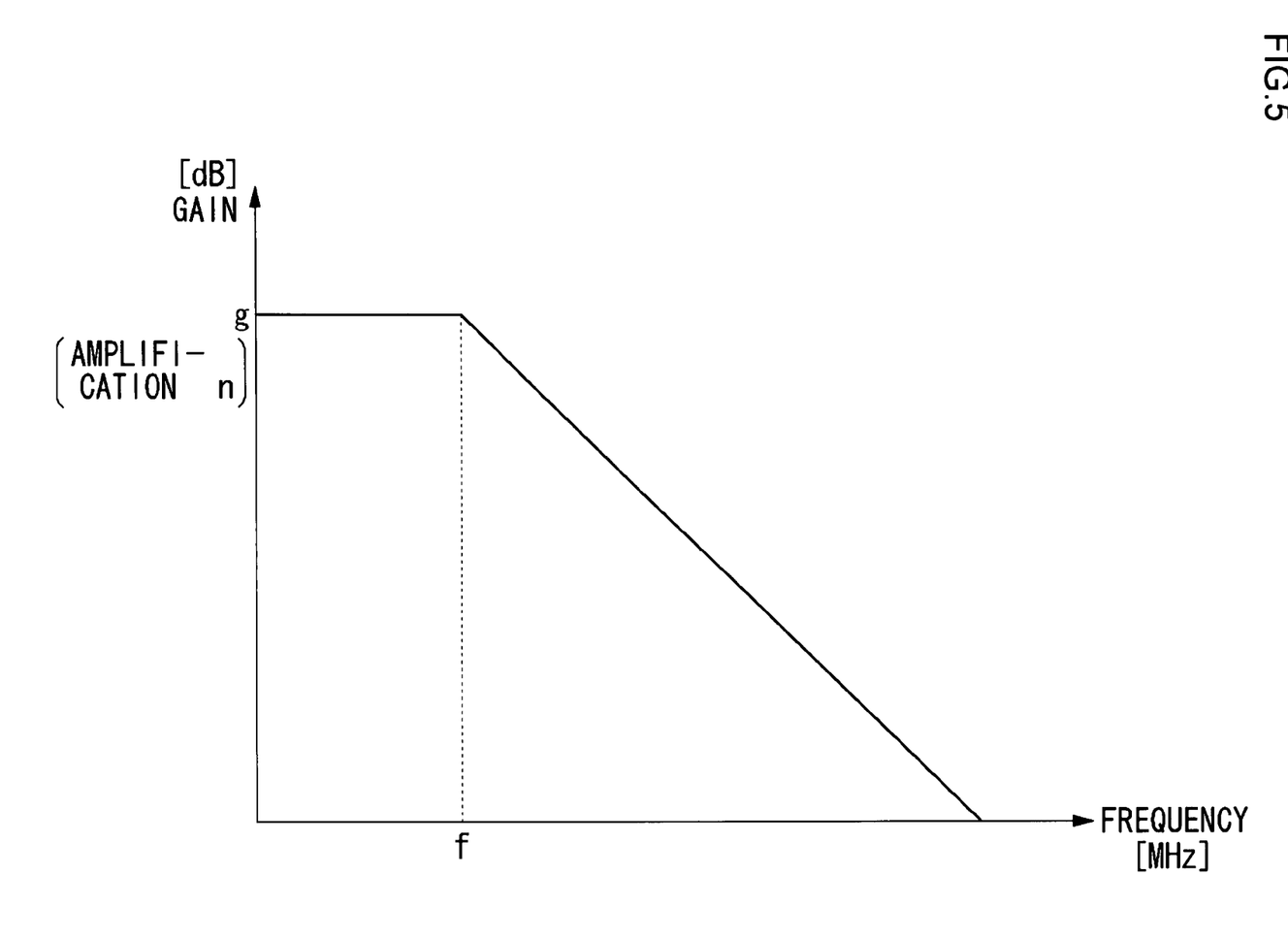
FIG. 5 is a graph showing the relationship between the operation frequency and the gain of the conventional differential amplifier.

Conventional differential amplifiers have the characteristic that their gains decrease with the increasing frequencies of signals to be amplified. FIG. 5 shows the relationship between the operating frequency and the gain of a conventional differential amplifier. For example, in a differential amplifier having a gain of g [dB], signals having frequencies no higher than f can be amplified at the gain g. Signals exceeding the frequency f can only be amplified at amplifications lower than the gain g. That is, if the input signal contains high frequency components beyond the operating frequency range, the ratio between the amount of the input current flowing in response to the input voltage and the amount of the output current (hereinafter, referred to as amplification efficiency) drops as a whole. It has thus been the case that the amplification efficiency drops when differential amplifiers are designed for higher gains. On the other hand, higher gains have had to be sacrificed in order to design for higher amplification efficiencies.

SUMMARY OF THE INVENTION

The inventor has achieved the present invention in view of the foregoing understanding. It is thus an object of the invention to improve the efficiency of amplification by an amplifier.

One of the aspects of the present invention is an amplifier. This amplifier is a circuit which amplifies an input signal, comprising a plurality of amplifier stages each having a gain smaller than a target gain. The plurality of amplifier stages are connected in parallel and share the load of current amplification, and add output currents obtained from their respective amplifications to achieve the target gain as a whole.

According to this aspect, the operating frequency range can be extended toward higher frequencies as compared to the case where the target gain is achieved by a single amplifier stage. It is therefore possible to improve the amplification efficiency of signals containing high frequency components.

Another aspect of the present invention is also an amplifier. This amplifier is a circuit which amplifies an input signal, comprising a plurality of amplifier stages each having an operating frequency range covering a target high frequency range. The plurality of amplifier stages are connected in parallel and share the load of current amplification, and add output currents obtained from their respective amplifications to amplify the input signal in the high frequency range at a total gain higher than when amplifying it by using a single amplifier stage.

According to this aspect, high frequency components can be amplified at a higher gain. It is therefore possible to improve the amplification efficiency of signals containing high frequency components.

The amplifiers may further include a plurality of input stages which receives the input signal. The plurality of amplifier stages may amplify currents flowing through the plurality of input stages in accordance with the voltage of the input signal, respectively.

The amplifiers may further include an input stage which receives the input signal. The plurality of amplifier stages divide a current flowing in accordance with the voltage of the input signal, and amplify the resultants, respectively. In this case, the circuit area can be suppressed smaller than when a plurality of input stages are formed.

The input stage(s) may include a pair of differential input terminals which receive the input signal. The plurality of amplifier stages may differentially amplify input currents flowing in accordance with the input signal, respectively. For example, the amplifier may be configured as a differential amplifier. Even in this case, at least any one of the foregoing effects can be obtained.

Incidentally, any combinations of the foregoing components, and the components and expressions of the present invention replaced with methods, apparatuses, circuits, and the like mutually are also intended to constitute applicable aspects of the present invention.

DETAILED DESCRIPTION OF THE INVENTION

First Embodiment

A differential amplifier according to a first embodiment of the present invention has two amplifier stages each having a gain set at ½ the final target gain. The two systems of output currents are added after the amplification. Adding the output currents not only provides the final gain as intended initially, but also makes the frequency characteristics of the respective amplifier stages more preferable than when the target gain is achieved by an amplifier stage of single stage configuration. That is, as compared to the amplifier of single stage configuration, it is possible to improve the gain in the high frequency range for higher amplification efficiency.

Figure 1:
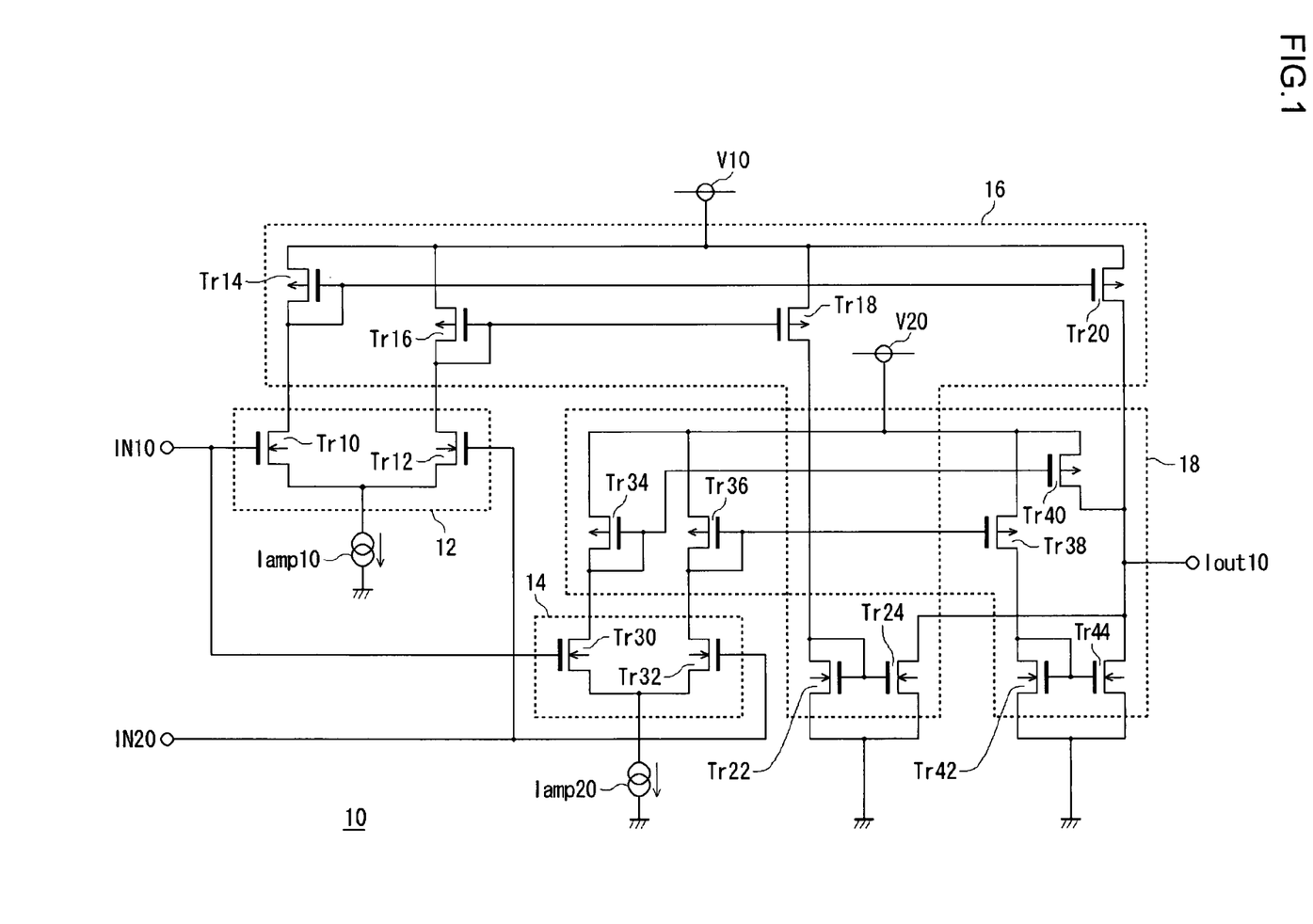
FIG. 1 is a diagram showing the configuration of a differential amplifier according to a first embodiment of the present invention.

FIG. 1 shows the configuration of the differential amplifier according to the first embodiment of the present invention. The differential amplifier 10 chiefly includes a plurality of differential input stages, or a first input stage 12 and a second input stage 14, and a plurality of differential amplifier stages, or a first amplifier stage 16 and a second amplifier stage 18. The first input stage 12 and the second input stage 14 are connected in parallel. The first amplifier stage 16 and the second amplifier stage 18 are also connected in parallel. The first amplifier stage 16 and the second amplifier stage 18 share the load of current amplification.

The first input stage 12 includes a first transistor Tr10 and a second transistor Tr12 which are n-channel MOS transistors. The second input stage 14 includes a ninth transistor Tr30 and a tenth transistor Tr32 which are n-channel MOS transistors. The first amplifier stage 16 includes a third transistor Tr14, a fourth transistor Tr16, a fifth transistor Tr18, and a sixth transistor Tr20 which are p-channel MOS transistors, and a seventh transistor Tr22 and an eighth transistor Tr24 which are n-channel MOS transistors. The second amplifier stage 18 includes an eleventh transistor Tr34, a twelfth transistor Tr36, a thirteenth transistor Tr38, and a fourteenth transistor Tr40 which are p-channel MOS transistors, and a fifteenth transistor Tr42 and a sixteenth transistor Tr44 which are n-channel MOS transistors.

The gates of the first transistor Tr10 and the ninth transistor Tr30 are connected to a first input terminal IN10 which is a noninverting input terminal. The gates of the second transistor Tr12 and the tenth transistor Tr32 are connected to a second input terminal IN20 which is an inverting input terminal. The common source of the first transistor Tr10 and the second transistor Tr12 is grounded via a first constant current source Iamp10. The currents to flow through the first transistor Tr10 and the second transistor Tr12 are biased by the first constant current source Iamp10. Similarly, the common source of the ninth transistor Tr30 and the tenth transistor Tr32 is grounded via a second constant current source Iamp20. The currents to flow through the ninth transistor Tr30 and the tenth transistor Tr32 are biased by the second constant current source Iamp20.

The drains of the first transistor Tr10 and the second transistor Tr12 are connected to the drains and gates of the third transistor Tr14 and the fourth transistor Tr16, respectively. The common source of the third transistor Tr14 and the fourth transistor Tr16 is connected to a first voltage source V10. The gates of the third transistor Tr14 and the sixth transistor Tr20 are connected to each other to constitute a current mirror. The gates of the fourth transistor Tr16 and the fifth transistor Tr18 are also connected to each other to constitute a current mirror. The common source of the fifth transistor Tr18 and the sixth transistor Tr20 is connected to the first voltage source V10. The drain of the fifth transistor Tr18 is connected to the drain and gate of the seventh transistor Tr22. The drain of the sixth transistor Tr20 is connected to an output terminal Iout10 and to the drain of the eighth transistor Tr24. The common source of the seventh transistor Tr22 and the eighth transistor Tr24 is grounded. The gates of the transistors Tr22 and Tr24 are connected to each other to constitute a current mirror.

The drains of the ninth transistor Tr30 and the tenth transistor Tr32 are connected to the drains and gates of the eleventh transistor Tr34 and the twelfth transistor Tr36, respectively. The common source of the eleventh transistor Tr34 and the twelfth transistor Tr36 is connected to a second voltage source V20. The gates of the eleventh transistor Tr34 and the fourteenth transistor Tr40 are connected to each other to constitute a current mirror. The gates of the twelfth transistor Tr36 and the thirteenth transistor Tr38 are also connected to each other to constitute a current mirror. The common source of the thirteenth transistor Tr38 and the fourteenth transistor Tr40 is connected to the second voltage source V20. The drain of the thirteenth transistor Tr38 is connected to the drain and gate of the fifteenth transistor Tr42. The drain of the fourteenth transistor Tr40 is connected to the output terminal Iout10 and to the drain of the sixteenth transistor Tr44. The common source of the fifteenth transistor Tr42 and the sixteenth transistor Tr44 is grounded. The gates of the transistors Tr42 and Tr44 are connected to each other to constitute a current mirror.

Hereinafter, description will be given of the operation of the differential amplifier 10 according to the first embodiment of the present invention. Initially, in the first input stage 12, a positive voltage is applied to the first input terminal IN10 and a negative voltage is applied to the second input terminal IN20. This turns the first transistor Tr10 on and the second transistor Tr12 off. The bias current of the first constant current source Iamp10 lowers the source voltage of the first transistor Tr10, so that a current flows from the drain to the source of the same. Consequently, the voltage applied to the first transistor Tr10 is converted into a current.

In the first amplifier stage 16, the drain and gate of the third transistor Tr14 drop in voltage due to the flow of the current through the first transistor Tr10 of the first input stage 12. The gate voltage of the third transistor Tr14 settles down at a value such that the third transistor Tr14 passes the same current as that flowing through the first transistor Tr10. The gate voltage of the third transistor Tr14 is given to the gate of the sixth transistor Tr20 because of the common gate. In accordance with this given voltage, a current flows from the source to the drain of the sixth transistor Tr20. Suppose here that the target amplification of the entire differential amplifier 10 is n times. The gate width of the sixth transistor Tr20 is then designed to pass a current n/2 times as high as that flowing through the third transistor Tr14. The current flowing through the sixth transistor Tr20 makes a source current to flow out of the output terminal Iout10.

Meanwhile, in the second input stage 14, when a positive voltage is applied to the first input terminal IN10 and a negative voltage is applied to the second input terminal IN20, the ninth transistor Tr30 turns on and the tenth transistor Tr32 turns off. The bias current of the second constant current source Iamp20 lowers the source voltage of the ninth transistor Tr30, so that a current flows from the drain to the source of the same. The voltage applied to the ninth transistor Tr30 is thus also converted into a current.

In the second amplifier stage 18, the drain and gate of the eleventh transistor Tr34 drop in voltage due to the flow of the current through the ninth transistor Tr30 of the second input stage 14. The gate voltage of the eleventh transistor Tr34 settles down at a value such that the eleventh transistor Tr34 passes a current having the same value as that flowing through the ninth transistor Tr30. The gate voltage of the eleventh transistor Tr34 is given to the gate of the fourteenth transistor Tr40 because of the common gate. In accordance with this given voltage, a current flows from the source to the drain of the fourteenth transistor Tr40. The gate width of the fourteenth transistor Tr40 is designed to pass a current n/2 times as high as that flowing through the eleventh transistor Tr34. The current flowing through the fourteenth transistor Tr40 also makes a source current to flow out of the output terminal Iout10. As a result, the sum of the current from the sixth transistor Tr20 and the current from the fourteenth transistor Tr40 is output from the output terminal Iout10. These currents are ones obtained by amplifying the current flowing through the first transistor Tr10 and the current flowing through the ninth transistor Tr30 n/2 times each, and can thus achieve an amplification of n times in total.

Next, in the first input stage 12, when a negative voltage is applied to the first input terminal IN10 and a positive voltage is applied to the second input terminal IN20, the first transistor Tr10 turns off and the second transistor Tr12 turns on. The bias current of the first constant current source Iamp10 lowers the source voltage of the second transistor Tr12, so that a current flows from the drain to the source of the same. Consequently, the voltage applied to the second transistor Tr12 is converted into a current.

In the first amplifier stage 16, the drain and gate of the fourth transistor Tr16 drop in voltage due to the flow of the current through the second transistor Tr12 of the first input stage 12. The gate voltage of the fourth transistor Tr16 settles down at a value such that the fourth transistor Tr16 passes the same current as that flowing through the second transistor Tr12. The gate voltage of the fourth transistor Tr16 is given to the gate of the fifth transistor Tr18 because of the common gate. In accordance with this given voltage, a current flows from the source to the drain of the fifth transistor Tr18. The gate width of the fifth transistor Tr18 is designed to pass a current equal to that flowing through the fourth transistor Tr16.

Due to the flow of the current through the fifth transistor Tr18, the drain and gate of the seventh transistor Tr22 rise in voltage. Thus, the current flows from the drain to the source of the seventh transistor Tr22. The gate voltage of the seventh transistor Tr22 settles down at a value such that the seventh transistor Tr22 passes the same current as that flowing through the fifth transistor Tr18. The gate voltage of the seventh transistor Tr22 is given to the gate of the eighth transistor Tr24 because of the common gate. In accordance with this given voltage, a current flows from the drain to the source of the eighth transistor Tr24. The gate width of the eighth transistor Tr24 is designed to pass a current n/2 times as high as that flowing through the seventh transistor Tr22. The current flowing through the eighth transistor Tr24 makes a sink current which is drawn in from exterior through the output terminal Iout10.

Meanwhile, in the second input stage 14, when a negative voltage is applied to the first input terminal IN10 and a positive voltage is applied to the second input terminal IN20, the ninth transistor Tr30 turns off and the tenth transistor Tr32 turns on. The bias current of the second constant current source Iamp20 lowers the source voltage of the tenth transistor Tr32, so that a current flows from the drain to the source of the same. Consequently, the voltage applied to the tenth transistor Tr32 is also converted into a current.

In the second amplifier stage 18, the drain and gate of the twelfth transistor Tr36 drop in voltage due to the flow of the current through the tenth transistor Tr32 of the second input stage 14. The gate voltage of the twelfth transistor Tr36 settles down at a value such that the twelfth transistor Tr36 passes a current having the same value as that flowing through the tenth transistor Tr32. The gate voltage of the twelfth transistor Tr36 is given to the gate of the thirteenth transistor Tr38 because of the common gate. In accordance with this given voltage, a current flows from the source to the drain of the thirteenth transistor Tr38. The gate width of the thirteenth transistor Tr38 is designed to pass a current equal to that flowing through the twelfth transistor Tr36.

Due to the flow of the current through the thirteenth transistor Tr38, the drain and gate of the fifteenth transistor Tr42 rise in voltage. Thus, the current flows from the drain to the source of the fifteenth transistor Tr42. The gate voltage of the fifteenth transistor Tr42 settles down at a value such that the fifteenth transistor Tr42 passes the same current as that flowing through the thirteenth transistor Tr38. The gate voltage of the fifteenth transistor Tr42 is given to the gate of the sixteenth transistor Tr44 because of the common gate. In accordance with this given voltage, a current flows from the drain to the source of the sixteenth transistor Tr44. The gate width of the sixteenth transistor Tr44 is designed to pass a current n/2 times as high as that flowing through the fifteenth transistor Tr42. The current flowing through the sixteenth transistor Tr44 also makes a sink current which is drawn in from exterior through the output terminal Iout10. As a result, the sum of the current toward the fourteenth transistor Tr40 and the current toward the sixteenth transistor Tr44 flows in through the output terminal Iout10. These currents are ones obtained by amplifying the current flowing through the second transistor Tr12 and the current flowing through the tenth transistor Tr32 n/2 times each, and can thus achieve an amplification of n times in total.

As a result of the foregoing operations, when a positive voltage is applied to the first input terminal IN10, the source current obtained by amplifying the current flowing in response to the voltage n times appears on the output terminal Iout10. When a positive voltage is applied to the second input terminal IN20, the sink current obtained by amplify the current flowing in response to the voltage n times appears on the output terminal Iout10. The sixth transistor Tr20, the eighth transistor Tr24, the fourteenth transistor Tr40, and the sixteenth transistor Tr44 for amplifying a current n/2 times have an extended frequency range as compared to transistors for amplifying a current n times. Consequently, the entire differential amplifier 10 can provide frequency characteristics more preferable than when using those transistors for amplifying a current n times, and achieve the target gain as well.

Figure 2:
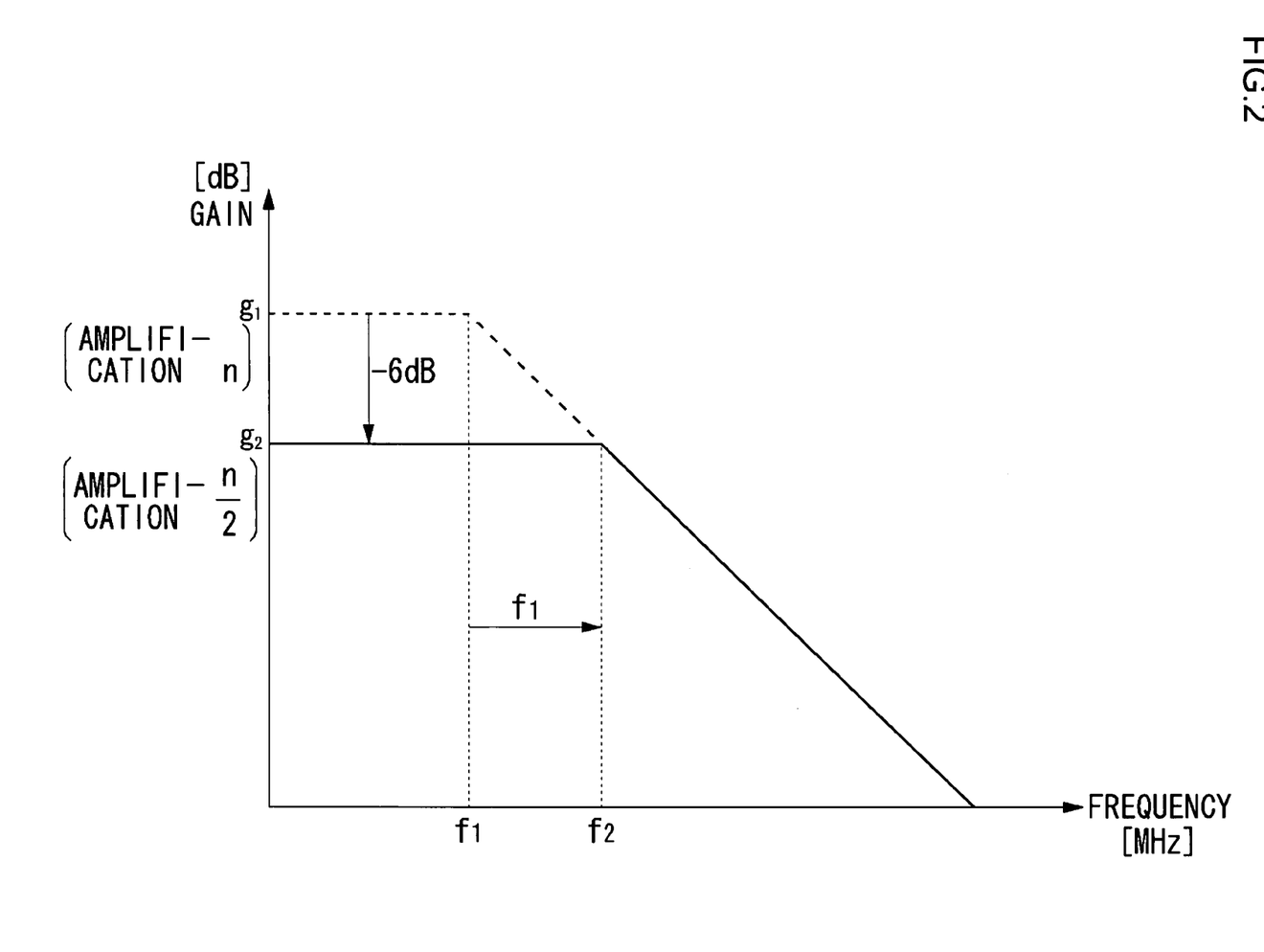
FIG. 2 is a graph showing the relationship between the operation frequency and the gain of the differential amplifier.

FIG. 2 shows the relationship between the operating frequency and the gain of the differential amplifier 10. The abscissa indicates the operating frequency [MHz], and the ordinate the gain [dB]. Both the axes are in logarithmic scale. When the differential amplifier 10 is designed for an amplification of n times, the maximum operating frequency at which a gain of $g_1$ [dB] is available is $f_1$ [MHz]. In this case, the gain falls below $g_1$ for high frequency signals exceeding the frequency $f_1$, with a drop in amplification efficiency. The gain drops in proportion to an increase in the operating frequency.

When the differential amplifier 10 is designed for an amplification of n/2 times, the maximum operating frequency at which a gain of $g_2$ [dB] is available is $f_2$ [MHz]. The gain $g_2$ is a value 6 dB lower than the gain $g_1$, whereas the maximum operating frequency $f_2$ is twice as high as $f_1$. The differential amplifier 10 according to the first embodiment of the present invention provides two stages of amplifiers each having the gain of $g_2$ and the maximum operating frequency of $f_2$, and adds the outputs of these stages. It is therefore possible to achieve the gain of $g_1$ in a frequency domain higher than the maximum operating frequency $f_1$ which is for a single stage of n-time amplifier. The amplification efficiency for high frequency input signals can thus be improved.

Second Embodiment

A differential amplifier according to a second embodiment of the present invention comprises a single differential input stage and two differential amplifier stages. It is thus different from the first embodiment of the present invention which has two differential input stages. Since the differential amplifier of the second embodiment has the single differential input stage, its circuit area can be made smaller than that of the first embodiment accordingly.

Figure 3:
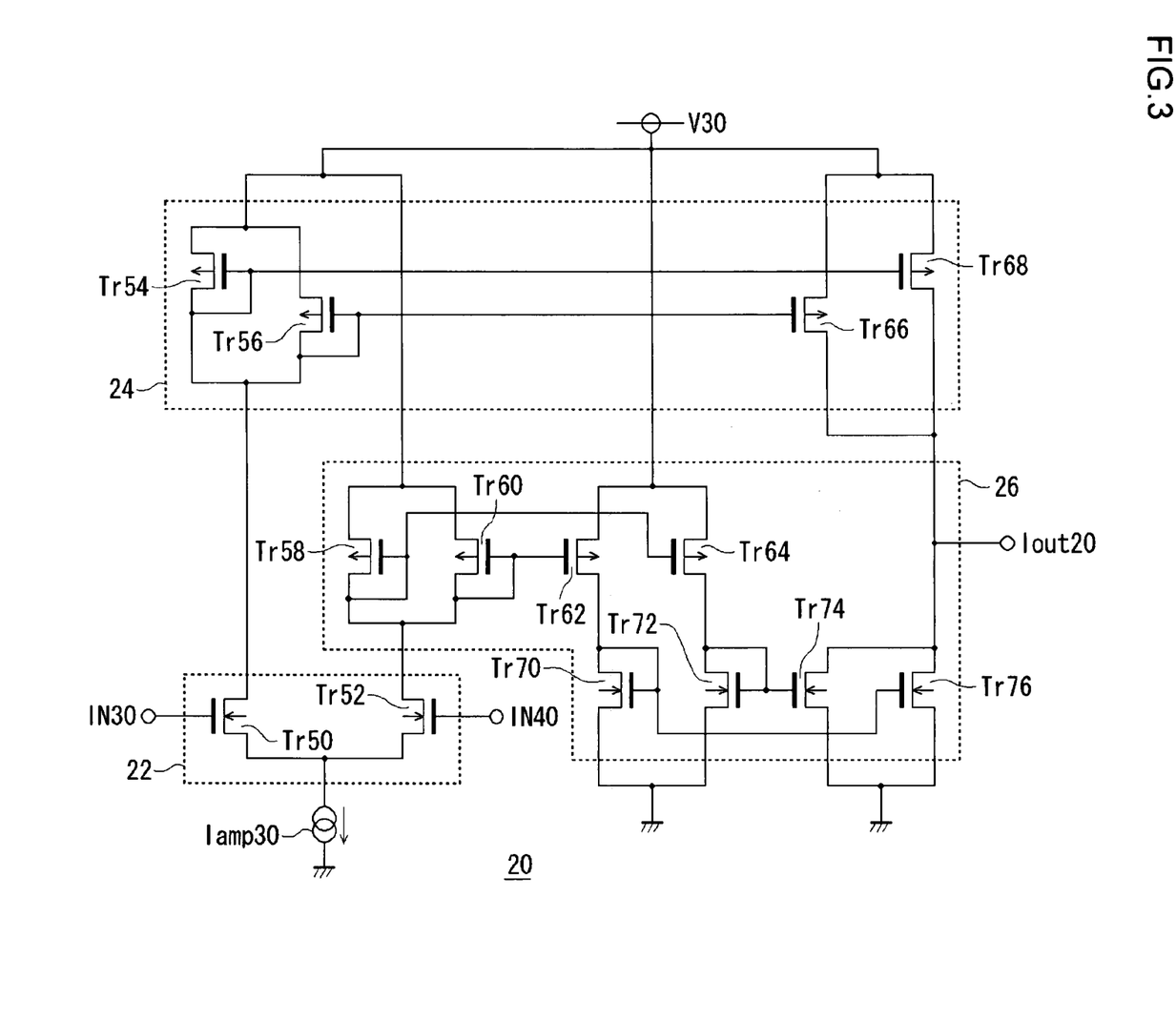
FIG. 3 is a diagram showing the configuration of a differential amplifier according to a second embodiment of the present invention.

FIG. 3 shows the configuration of the differential amplifier according to the second embodiment of the present invention. The differential amplifier 20 chiefly includes a single differential input stage, or an input stage 22, and a plurality of differential amplifier stages, or a first amplifier stage 24 and a second amplifier stage 26. The first amplifier stage 24 and the second amplifier stage 26 are connected in parallel, and respective pluralities of transistors included therein share the load of current amplification.

The input stage 22 includes a first transistor Tr50 and a second transistor Tr52 which are n-channel MOS transistors. The first amplifier stage 24 includes a third transistor Tr54, a fourth transistor Tr56, a fifth transistor Tr66, and a sixth transistor Tr68 which are p-channel MOS transistors. The second amplifier stage 26 includes a seventh transistor Tr58, an eighth transistor Tr60, a ninth transistor Tr62, and a tenth transistor Tr64 which are p-channel MOS transistors, and an eleventh transistor Tr70, a twelfth transistor Tr72, a thirteenth transistor Tr74, and a fourteenth transistor Tr76 which are n-channel MOS transistors.

The gate of the first transistor Tr50 is connected to a first input terminal IN30, a noninverting input terminal. The gate of the second transistor Tr52 is connected to a second input terminal IN40, an inverting input terminal. The common source of the first transistor Tr50 and the second transistor Tr52 is grounded via a constant current source Iamp30.

In the first amplifier stage 24, the third transistor Tr54 and the fourth transistor Tr56 are connected in parallel. The common drain thereof is connected to the drain of the first transistor Tr50. The common source thereof is connected to a voltage source V30. The gates and drains of the third transistor Tr54 and the fourth transistor Tr56 are connected to each other. The fifth transistor Tr66 and the sixth transistor Tr68 are also connected in parallel. The third transistor Tr54 and the sixth transistor Tr68 are connected at their gates to constitute a current mirror. So are the fourth transistor Tr56 and the fifth transistor Tr66. The common source of the fifth transistor Tr66 and the sixth transistor Tr68 are connected to the voltage source V30. The common drain thereof is connected to an output terminal Iout20.

The seventh transistor Tr58 and the eighth transistor Tr60 are connected in parallel. The common drain thereof is connected to the drain of the second transistor Tr52. The common source thereof is connected to the voltage source V30. The gates and drains of the seventh transistor Tr58 and the eighth transistor Tr60 are connected to each other. The seventh transistor Tr58 and the tenth transistor Tr64 are connected at their gates to constitute a current mirror. So are the eighth transistor Tr60 and the ninth transistor Tr62. The common source of the ninth transistor Tr62 and the tenth transistor Tr64 is connected to the voltage source V30.

The drain of the ninth transistor Tr62 is connected to the drain of the eleventh transistor Tr70. The drain of the tenth transistor Tr64 is connected to the drain of the twelfth transistor Tr72. The gates and drains of the eleventh transistor Tr70 and the twelfth transistor Tr72 are connected to each other. The common source thereof is grounded. The eleventh transistor Tr70 and the fourteenth transistor Tr76 are connected at their gates to constitute a current mirror. So are the twelfth transistor Tr72 and the thirteenth transistor Tr74. The common source of the thirteenth transistor Tr74 and the fourteenth transistor Tr76 is grounded. The common drain thereof is connected to the output terminal Iout20.

Hereinafter, description will be given of the operation of the differential amplifier 20 according to the second embodiment of the present invention. Initially, in the input stage 22, when a positive voltage is applied to the first input terminal IN30 and a negative voltage is applied to the second input terminal IN40, the first transistor Tr50 turns on and the second transistor Tr52 turns off. The bias current of the constant current source Iamp30 lowers the source voltage of the first transistor Tr50, so that a current flows from the drain to the source of the same. Consequently, the voltage applied to the first transistor Tr50 is converted into a current.

In the first amplifier stage 24, the drains and gates of the third transistor Tr54 and the fourth transistor Tr56 drop in voltage due to the flow of the current through the first transistor Tr50 of the input stage 22. The gate voltages of the third transistor Tr54 and the fourth transistor Tr56 settle down at a value such that the-third transistor Tr54 and the fourth transistor Tr56 pass currents 1/2 as high as that flowing through the first transistor Tr50, respectively. The gate voltages of the third transistor Tr54 and the fourth transistor Tr56 are given to the gates of the sixth transistor Tr68 and the fifth transistor Tr66 because of the common gates, respectively. In accordance with these given voltages, currents flow from the sources to the drains of the fifth transistor Tr66 and the sixth transistor Tr68. Here, when the target amplification of the entire differential amplifier 20 is n times, the gate widths of the fifth transistor Tr66 and the sixth transistor Tr68 are designed to pass currents n/2 times as high as those flowing through the third transistor Tr54 and the fourth transistor Tr56, respectively. The currents flowing through the fifth transistor Tr66 and the sixth transistor Tr68 make source currents to flow out of the output terminal Iout20. The sum of the currents flowing through the fifth transistor Tr66 and the sixth transistor Tr68 is n times as high as the current flowing through the first transistor Tr50.

Next, in the input stage 22, a negative voltage is applied to the first input terminal IN30 and a positive voltage is applied to the second input terminal IN40. This turns the first transistor Tr50 off and the second transistor Tr52 on. The bias current of the constant current source Iamp30 lowers the source voltage of the second transistor Tr52, so that a current flows from the drain to the source of the same. Consequently, the voltage applied to the second transistor Tr52 is converted into a current.

In the second amplifier stage 26, the drains and gates of the seventh transistor Tr58 and the eighth transistor Tr60 drop in voltage due to the flow of the current through the second transistor Tr52 of the input stage 22. The gate voltages of the seventh transistor Tr58 and the eighth transistor Tr60 settle down at a value such that the seventh transistor Tr58 and the eighth transistor Tr60 pass currents 1/2 as high as that flowing through the second transistor Tr52, respectively. The gate voltages of the seventh transistor Tr58 and the eighth transistor Tr60 are given to the gates of the tenth transistor Tr64 and the ninth transistor Tr62 because of the common gates, respectively. In accordance with these given voltages, currents flow from the sources to the drains of the ninth transistor Tr62 and the tenth transistor Tr64. The gate widths of the ninth transistor Tr62 and the tenth transistor Tr64 are designed so as to pass currents equal to those passing through the seventh transistor Tr58 and the eighth transistor Tr60.

Due to the flow of the currents through the ninth transistor Tr62 and the tenth transistor Tr64, the drains and gates of the eleventh transistor Tr70 and the twelfth transistor Tr72 rise in voltage. Thus, the currents flow from the drains to the sources of the eleventh transistor Tr70 and the twelfth transistor Tr72. The gate voltages of the eleventh transistor Tr70 and the twelfth transistor Tr72 settle down at a value such that the eleventh transistor Tr70 and the twelfth transistor Tr72 pass the same currents as those flowing through the ninth transistor Tr62 and the tenth transistor Tr64.

The gate voltage of the eleventh transistor Tr70 is given to the fourteenth transistor Tr76 because of the common gate. The gate voltage of the twelfth transistor Tr72 is given to the thirteenth transistor Tr74 because of the common gate. In accordance with these given voltages, currents flow from the drains to the sources of the thirteenth transistor Tr74 and the fourteenth transistor Tr76. The gate widths of the thirteenth transistor Tr74 and the fourteenth transistor Tr76 are designed so as to pass currents n/2 times as high as those passing through the eleventh transistor Tr70 and the twelfth transistor Tr72. The currents flowing through the thirteenth transistor Tr74 and the fourteenth transistor Tr76 make sink currents which are drawn in from exterior through the output terminal Iout20. The sum of the currents flowing through the thirteenth transistor Tr74 and the fourteenth transistor Tr76 is n times as high as the current flowing through the second transistor Tr52.

As a result of the foregoing operations, when a positive voltage is applied to the first input terminal IN30, the source current obtained by amplifying the current flowing in response to the voltage n times appears on the output terminal Iout20. When a positive voltage is applied to the second input terminal IN40, the sink current obtained by amplifying the current flowing in response to the voltage n times appears on the output terminal Iout20. The fifth transistor Tr66, the sixth transistor Tr68, the thirteenth transistor Tr74, and the fourteenth transistor Tr76 for amplifying a current n/2 times have an extended frequency range as compared to transistors for amplifying a current n times. Consequently, the entire differential amplifier 20 can provide frequency characteristics more preferable than when using those transistors for amplifying a current n times, and achieve the target gain as well.

Up to this point, the present invention has been described in conjunction with the embodiments thereof. These embodiments are given solely by way of illustration. It will be understood by those skilled in the art that various modifications may be made to combinations of the foregoing components and processes, and all such modifications are also intended to fall within the scope of the present invention. The following provides some of the modifications.

In the foregoing embodiments of the present invention, each of the current-amplifying transistors is given a gain 1/2 the target gain of the entire apparatus. In a modification, each of the current-amplifying transistors may be given a gain of arbitrary value smaller than the target gain of the entire apparatus.

The embodiments of the present invention have dealt with the cases where the differential amplifier stages are configured in two stages. In a modification, three or more differential amplifier stages may be used. Similarly, three or more differential input stages may also be used.

The first embodiment of the present invention has dealt with the case where the third transistor Tr14, the fourth transistor Tr16, the fifth transistor Tr18, the sixth transistor Tr20, the seventh transistor Tr22, and the eighth transistor Tr24 are grouped into the first amplifier stage 16. Similarly, the eleventh transistor Tr34, the twelfth transistor Tr36, the thirteenth transistor Tr38, the fourteenth transistor Tr40, the fifteenth transistor Tr42, and the sixteenth transistor Tr44 are grouped into the second amplifier stage 18. In a modification, the third transistor Tr14, the sixth transistor Tr20, the eleventh transistor Tr34, and the fourteenth transistor Tr40 may constitute the first amplifier stage 16. Similarly, the fourth transistor Tr16, the fifth transistor Tr18, the seventh transistor Tr22, the eighth transistor Tr24, the twelfth transistor Tr36, the thirteenth transistor Tr38, the fifteenth transistor Tr42, and the sixteenth transistor Tr44 may constitute the second amplifier stage 18.

The second embodiment of the present invention has dealt with the case where the third transistor Tr54, the fourth transistor Tr56, the fifth transistor Tr66, and the sixth transistor Tr68 are grouped into the first amplifier stage 24. Similarly, the seventh transistor Tr58, the eighth transistor Tr60, the ninth transistor Tr62, the tenth transistor Tr64, the eleventh transistor Tr70, the twelfth transistor Tr72, the thirteenth transistor Tr74, and the fourteenth transistor Tr76 are grouped into the second amplifier stage 26. In a modification, the third transistor Tr54, the sixth transistor Tr68, the seventh transistor Tr58, the tenth transistor Tr64, the twelfth transistor Tr72, and the thirteenth transistor Tr74 may constitute the first amplifier stage 24. Similarly, the fourth transistor Tr56, the fifth transistor Tr66, the eighth transistor Tr60, the ninth transistor Tr62, the eleventh transistor Tr70, and the fourteenth transistor Tr76 may constitute the second amplifier stage 26.

In the first embodiment of the present invention, the current mirror consisting of the fourth transistor Tr16 and the fifth transistor Tr18 is set to a current amplification ratio of 1:1. The current mirror consisting of the seventh transistor Tr22 and the eighth transistor Tr24 is set to a current amplification ratio of 1:n/2. In a modification, the fourth transistor Tr16 and the fifth transistor Tr18 may be set to a current amplification ratio of 1:x, and the seventh transistor Tr22 and the eighth transistor Tr24 a current amplification ratio of 1:y. Here, the product of x and y shall be n/2. Similarly, the current mirror consisting of the twelfth transistor Tr36 and the thirteenth transistor Tr38 may be set to a current amplification ratio of 1:x, and the current mirror consisting of the fifteenth transistor Tr42 and the sixteenth transistor Tr44 a current amplification ratio of 1:y. The product of x and y shall be n/2. Even in this case, the amplification of n times can be achieved as a whole.

In the second embodiment of the present invention, the current mirror consisting of the seventh transistor Tr58 and the tenth transistor Tr64, and the current mirror consisting of the eighth transistor Tr60 and the ninth transistor Tr62, both are set to a current amplification ratio of 1:1. The current mirror consisting of the eleventh transistor Tr70 and the fourteenth transistor Tr76, and the current mirror consisting of the twelfth transistor Tr72 and the thirteenth transistor Tr74, both are set to a current amplification ratio of 1:n/2. In a modification, the seventh transistor Tr58 and the tenth transistor Tr64, and the eighth transistor Tr60 and the ninth transistor Tr62, may be set to a current amplification ratio of 1:x. The eleventh transistor Tr70 and the fourteenth transistor Tr76, and the twelfth transistor Tr72 and the thirteenth transistor Tr74, may be set to a current amplification ratio of 1:y. Here, the product of x and y shall be n/2. Even in this case, the amplification of n times can be achieved as a whole.

In a modification, the first input stage 12 and the second input stage 14 according to the first embodiment of the present invention may include the first input terminal IN10 and the second input terminal IN20, respectively. Similarly, in another modification, the input stage 22 according to the second embodiment of the present invention may include the first input terminal IN30 and the second input terminal IN40.

In the embodiments of the present invention, the amplifiers set forth in claims are configured as differential amplifiers. In a modification, the amplifiers set forth in claims may be realized as amplifiers other than differential amplifiers.

What is claimed is:

1. An amplifier which amplifies an input signal, comprising:
   an input stage which receives the input signal;
   a plurality of amplifier stages each having a gain smaller than a target gain, wherein
   the input stage includes a pair of differential input terminals for receiving the input signal;
   the plurality of amplifier stages are connected in parallel, divide a current proportional to the input signal, subject divided currents to differential amplification, and add output currents obtained from their respective amplifications to achieve the target gain as a whole;
   at least one of the plurality of amplifier stages including a first current mirror circuit and a second current mirror circuit each of which amplifies the divided current by a gain of x, and a third current mirror circuit and a fourth current mirror circuit which amplify currents amplified by the first current mirror circuit and the second current mirror circuit respectively, by a gain of y, and wherein
   gains of the first through fourth current mirror circuits are designed such that a product of x and y is n/2, wherein n denotes the target gain.

* * * * *